US007622739B2

(12) United States Patent  
Kim

(10) Patent No.: US 7,622,739 B2  
(45) Date of Patent: Nov. 24, 2009

(54) THIN FILM TRANSISTOR FOR FLAT PANEL DISPLAY AND METHOD OF FABRICATING THE SAME

(75) Inventor: Jong-yun Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 173 days.

(21) Appl. No.: 11/949,953

(22) Filed: Dec. 4, 2007

(65) Prior Publication Data

US 2008/0246034 A1  Oct. 9, 2008

(30) Foreign Application Priority Data

Apr. 5, 2007  (KR) ...................... 10-2007-0033840

(51) Int. Cl.
*H01L 29/04* (2006.01)
*H01L 21/336* (2006.01)

(52) U.S. Cl. .......... 257/59; 257/E29.273; 257/E21.413; 438/151

(58) Field of Classification Search ................... 257/59, 257/72, E29.273, E29.275, E21.413; 438/151; 349/43

See application file for complete search history.

(56) References Cited

U.S. PATENT DOCUMENTS 7,009,204 B2 * 3/2006 Tsai et al. ..................... 257/59

7,148,506 B2 * 12/2006 Zhang .......................... 257/59
2003/0119230 A1 * 6/2003 Chida et al. .................. 438/149

FOREIGN PATENT DOCUMENTS

| JP | 7-263536 | 10/1995 |
| JP | 10-148847 | 6/1998 |
| JP | 2004-165241 | 6/2004 |
| JP | 2005-157220 | 6/2005 |
| KR | 2000-14518 | 3/2000 |
| KR | 2003-2051 | 1/2003 |
| KR | 2005-70909 | 7/2005 |

OTHER PUBLICATIONS

Notice of Allowance issued in Korean Patent Application No. 2007-33840 on Oct. 28, 2008.

* cited by examiner

*Primary Examiner*—Sue Purvis
*Assistant Examiner*—Scott Stowe
(74) *Attorney, Agent, or Firm*—Stein McEwen, LLP

(57) ABSTRACT

A thin film transistor for a flat panel display, and more particularly to a thin film transistor for a flat panel display having a protrusion in a part of a gate electrode includes a substrate on which an insulating layer is deposited, a semiconductor layer, which is a layer having predetermined width and length on the insulating layer, provided with doping regions in a letter U shape and a channel region between the doping regions; a gate insulating layer formed on the semiconductor layer; a gate electrode formed on the gate insulating layer to traverse the doping region; and a protrusion, which is a part of the gate electrode, formed on the gate insulating layer to be opposed to the channel region.

20 Claims, 4 Drawing Sheets

THIN FILM TRANSISTOR FOR FLAT PANEL DISPLAY AND METHOD OF FABRICATING THE SAME

CROSS-REFERENCE TO RELATED APPLICATION

This application claims the benefit of Korean Application No. 2007-33840, filed Apr. 5, 2007 in the Korean Intellectual Property Office, the disclosure of which is incorporated herein by reference.

BACKGROUND OF THE INVENTION

1. Field of the Invention

Aspects of the present invention relate to a thin film transistor, and more particularly, to a thin film transistor for a flat panel display and a method of fabricating the same, in which the thin film transistor is capable of performing an on/off switching operation even when a short circuit is formed between contact holes formed on each end portion of a letter U shaped doping region in the thin film transistor.

2. Description of the Related Art

A thin film transistor has widely been used as an on/off switching device in flat panel displays, such as an active matrix organic light emitting diode (AMOLED) or an active matrix liquid crystal display (AMLCD). As a material of the thin film transistor, a thin film of polycrystalline silicon or amorphous silicon, etc., has widely been used. Recently, a crystallizing method using a laser has widely been used. Accordingly, there has been an increased interest in a polycrystalline silicon thin film with excellent current diving capability and rapid operation speed.

The polycrystalline silicon thin film has excellent mobility as compared to the amorphous silicon thin film. The polycrystalline silicon thin film can be formed by integration in a driving circuit on a substrate. Also, the polycrystalline silicon thin film allows implementation of high resolution displays as compared to a typical flat panel display using the amorphous silicon thin film. Thus, it has been recently been spotlighted that the polycrystalline silicon thin film has a tendency to be adopted to a high definition flat panel display such as the AMOLED or an AMLCD.

FIG. 1A is a plan view of a typical thin film transistor, and FIG. 1B is a cross-sectional view taken along a line A-A' in FIG. 1A. The typical thin film transistor includes a semiconductor layer 10, a doping region 20, a gate electrode 30, and a gate insulating layer 40. The semiconductor layer 10 uses amorphous silicon or polycrystalline silicon. The semiconductor layer 10 is formed as a layer having a predetermined width and length, and is provided with the doping region 20 through a doping of impurities.

The gate insulating layer 40, which is a layer that insulates the gate electrode 30 from the semiconductor layer 10, commonly uses material such as $SiN_x$ or $SiO_2$, etc. The gate insulating layer 40 is formed on the semiconductor layer 10, and the gate electrode 30 is formed on the gate insulating layer 40. The gate electrode 30 is provided to supply a voltage and is mainly formed of Mo or MoW, etc. Contact holes (not shown) are formed on each end portion 21 of the doping region 20, wherein each contact hole is provided with source and drain electrodes (not shown). The corresponding active layer (not shown) between the source and drain electrodes becomes a channel region of the thin film transistor.

FIG. 2 is a plan view of a typical thin film transistor when a short circuit occurs. Currently, display products are highly integrated to implement display of high resolution images. In order to minimize the thin film transistor in correspondence with the highly integrated display, the size of the semiconductor layer 10 is formed to be as small as possible, but the width of the end portion 21 (on which the contact holes are to be formed) of the doping region 20 should be formed to be wider than the remainder of the doping region 20.

Generally, the semiconductor layer 10 is formed through a deposition and laser crystallization of the amorphous silicon or the amorphous silicon and a subsequent doping of impurities. However, since the width of the end portion 21 of each doping region 20 is wider as compared to that of the remainder of the doping region 20, there is high possibility of unintended doping of a connection region 50 connecting the end portion 21 of each doping region 20 during the impurities doping process.

If the connection region 50 is doped as explained above, the contact holes are short-circuited and a current always flows therebetween without passing through the thin film transistor. Accordingly, the thin film transistor cannot implement an on/off switching operation. Therefore, the pixels are not normally operated in a region of a display where the short-circuited thin film transistor exists, causing bad lighting problems (pixel defects) such as bright spot (hot pixel), dark spot (dead pixel), and bad clustering (defective pixel clustering), etc.

SUMMARY OF THE INVENTION

Aspects of the present invention are proposed to overcome the above and/or other problems and to have various advantages. Accordingly, it is an aspect of the present invention to prevent or reduce bad lighting (or pixel defects) of a display by enabling a switching function of a thin film transistor to occur even when contact holes are short-circuited by forming a protrusion in a gate electrode on a thin film transistor for a flat panel display having a U letter shaped doping region so as to maintain a voltage difference used for the switching function.

According to an aspect of the present invention, there is provided a thin film transistor of a flat panel display including: a substrate on which an insulating layer is deposited, a semiconductor layer, which is a layer having width and length on the insulating layer, provided with doping regions in a letter U shape and a channel region situated between the doping regions; a gate insulating layer formed on the semiconductor layer; a gate electrode formed on the gate insulating layer to traverse the doping region; and a protrusion, which is a part of the gate electrode, formed on the gate insulating layer to be opposed to the channel region.

When the doping region is formed in the letter U shape in the thin film transistor for a flat panel display, contact hole formed on each end portion of the doping region in the letter U shape can be short-circuited. According to an aspect of the present invention, the protrusion, which is a part of the gate electrode, is formed, making it possible to perform an on/off switching even when such a short-circuit occurs.

According to another aspect of the present invention, a thin film transistor of a flat panel display includes a semiconductor layer having doped regions and a channel region positioned between the doped regions a gate insulating layer formed on the semiconductor layer, and a gate structure formed on the gate insulating layer and including a primary gate and a secondary gate, the primary gate being formed over the doped regions and across the channel region to switch the thin film transistor, and the secondary gate being formed over the channel region to switch the thin film transistor if a short circuit is formed between the doped regions.

According to another aspect of the present invention, a method of fabricating a thin film transistor of a flat panel display includes forming a semiconductor layer having doped regions and a channel region positioned between the doped regions, forming a gate insulating layer on the semiconductor layer, and forming a gate structure on the gate insulating layer and including a primary gate and a secondary gate, the primary gate being formed over the doped regions and across the channel region to switch the thin film transistor, and the secondary gate being formed over the channel region to switch the thin film transistor if a short circuit is formed between the doped regions.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Figure 1A:
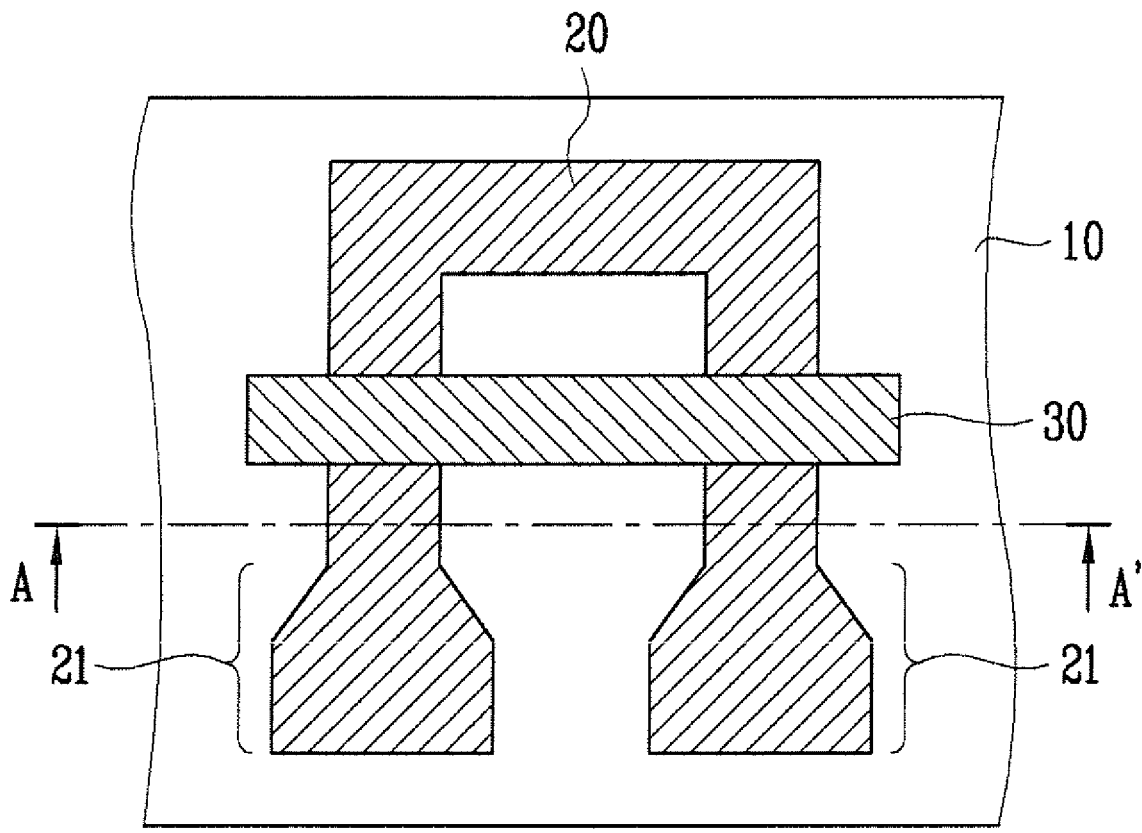
FIG. 1A is a plan view of a typical thin film transistor.
Figure 1B:
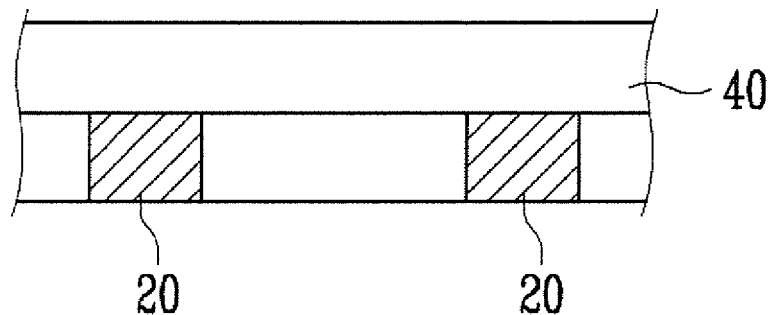
FIG. 1B is a cross-sectional view taken along a line A-A in FIG. 1A.

Reference will now be made in detail to the aspects of the present invention, examples of which are illustrated in the accompanying drawings, wherein like reference numerals refer to the like elements throughout. The aspects are described below in order to explain the present invention by referring to the figures.

In the figures, the dimensions of layers and regions may be exaggerated for clarity. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Figure 3A:
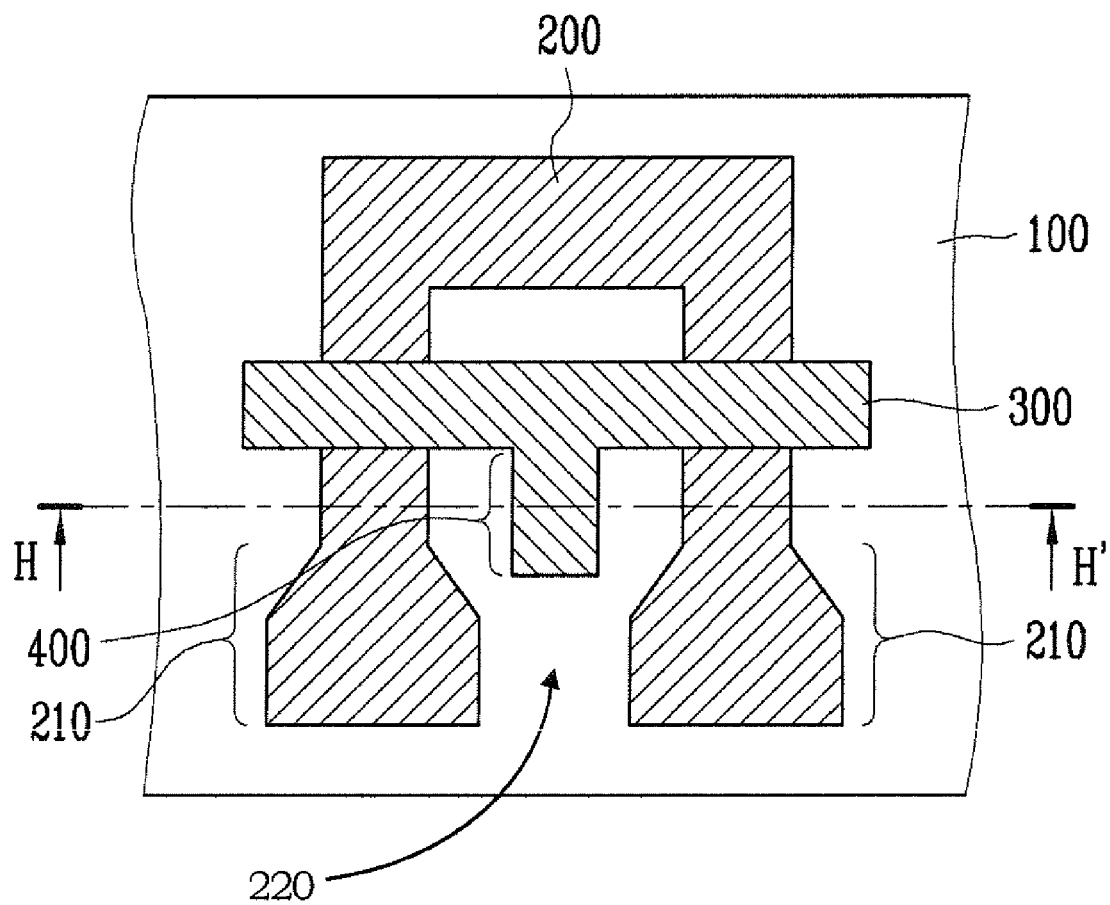
FIG. 3A is a plan view of a thin film transistor for a flat panel display according to an aspect of the present invention.
Figure 3B:
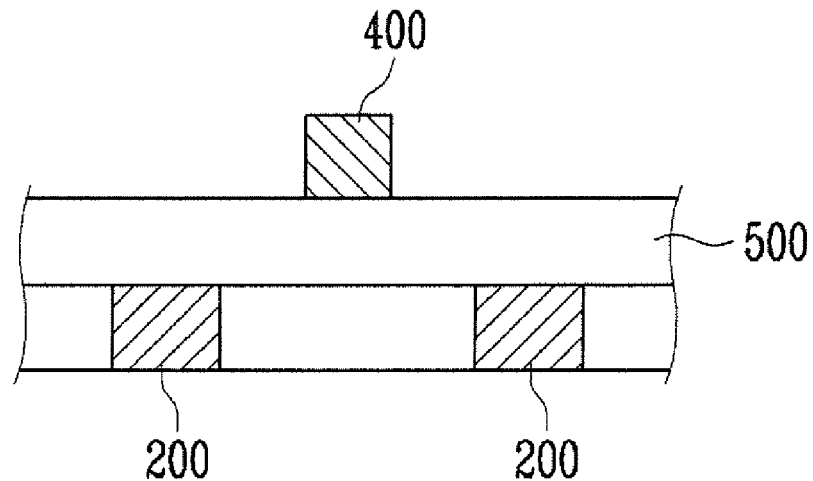
FIG. 3B is a cross-sectional view taken along a line H-H' in FIG. 3A.

FIG. 3A is a plan view of a thin film transistor for a flat panel display according to an aspect of the present invention, and FIG. 3B is a cross-sectional view taken along a line H-H' in FIG. 3A. The thin film transistor includes a semiconductor layer 100, a doping region (or a doped region) 200, a gate electrode 300, and a protrusion 400.

The semiconductor layer 100 is generally formed on an insulating layer (not shown) on which $SiO_2$ or $SiN_x$ of about several hundred nm is deposited. The insulating layer prevents the semiconductor layer 100 from being contaminated by impurities included within a glass substrate (not shown) during subsequent manufacturing processes of the thin film transistor. The semiconductor layer 100 uses amorphous silicon or polycrystalline silicon. The amorphous silicon refers to a silicon that, despite being similar to crystalline silicon in view of coordination number, joining angle, and joining length, etc., have regularity for a short range of atom, but does not have regularity for a long range of atom due to the existence of dangling-bond, etc.

Based on such structural characteristics of the amorphous silicon, there are a lot of defect states in a forbidden gap of an energy band gap of the amorphous silicon which cannot exist in the crystalline silicon. The electro-optical characteristic of the amorphous silicon sensitively depends on a distribution of energy in the defect states existing in the forbidden gap, making it possible to have a semiconducting characteristic at a level that enables the amorphous silicon to be used as a switch device by controlling the defect density. Also, the amorphous silicon has a characteristic of being easy to manufacture and being uniform despite having a low device characteristic. Accordingly, the amorphous silicon is currently used in the making of the semiconductor layer 100 in a large sized flat panel display.

Compared to the amorphous silicon, the polycrystalline silicon has high mobility and device characteristic that the amorphous silicon does not have. Accordingly, the polycrystalline silicon has advantages in that it can be included in a built-in driving circuit and can be used to provide high resolution images.

In order to form the semiconductor layer 100 with the polycrystalline silicon, the amorphous silicon is first deposited on the substrate on which the insulating layer is deposited. Thereafter, the amorphous silicon passes through a process of crystallization into the polycrystalline silicon, by being irradiated with an excimer laser, etc. In other aspects, other crystallization methods are usable, including a super grain silicon method or various metal induced crystallization methods, for example.

The doping region 200 is generally formed by doping impurities into the semiconductor layer 100 generally having a predetermined width and length. When the semiconductor layer 100 is a P-type layer (e.g., doped with P-type impurities), the doping region 200 is doped with N-type impurities, and when the semiconductor layer 100 is an N-type layer (e.g., doped with N-type impurities), the doping region 200 is doped with P-type impurities. If the doping region 200 is doped with the N-type impurities, a semiconductor is named as an N-type metal oxide semiconductor (NMOS), and if the doping region 200 is doped with the P-type impurities, a semiconductor is named as a P-type metal oxide semiconductor (PMOS).

Contact holes (not shown) are formed on each end portion 210 of the doping region 200, wherein each contact hole is provided with source and drain electrodes (not shown). The corresponding active layer between the source and drain electrodes becomes a channel region 220 of the thin film transistor.

The gate electrode 300 is formed on a gate insulating layer 500 and is to supply a voltage. As the material forming such a gate electrode 300, metal such as Mo or MoW, etc., is mainly used. In other aspects, other metals are usable.

The on/off switching of the thin film transistor is made by changing the voltage of the gate electrode 300. In the case of the PMOS, if the gate voltage is positive (+), the thin film transistor becomes an off state, and if the gate voltage is negative (−), the thin film transistor becomes an on state. Conversely, in the case of the NMOS, if the gate voltage is positive (+), the thin film transistor becomes an on state, and if the gate voltage is negative (−), the thin film transistor becomes an off state.

The protrusion 400 is a part of the gate electrode 300. The protrusion 400 is formed not to be overlapped with the doping region 200 and is situated between the doping regions 200 as shown in FIG. 3A. That is, the protrusion 400 is formed to be situated between prongs of the letter U shaped doping region 200 and may extend perpendicularly from the gate electrode 300, though not required. Such a protrusion 400 is a part of the gate electrode 300 so that the protrusion 400 is formed of the same material as that of the gate electrode 300, and also supplies the same voltage as that of the gate electrode 300. The protrusion 400 will be described later.

The gate insulating layer 500, which is a layer that insulates the gate electrode 300 from the semiconductor layer 100, commonly uses material such as $SiN_x$ or $SiO_2$, etc. The gate insulating layer 500, which is formed on the semiconductor layer 100, prevents or reduces the metal forming the gate electrode 300 from being diffused to the semiconductor layer 100.

Figure 3C:
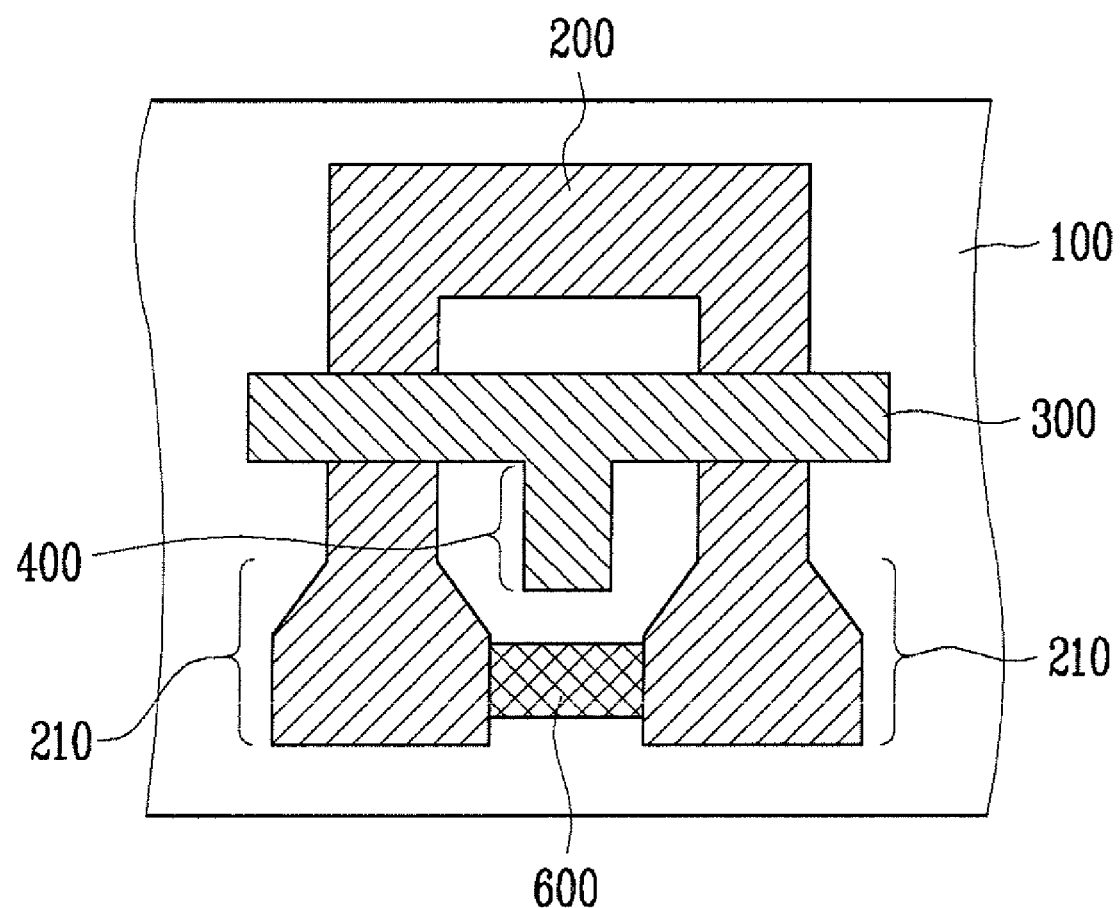
FIG. 3C is a plan view showing a case when a short circuit occurs in a thin film transistor for a flat panel display of FIGS. 3A and 3B.

FIG. 3C is a plan view showing a case when a short circuit occurs in a thin film transistor for a flat panel display of FIGS. 3A and 3B. In a typical case, display products have been subjected to a high degree of integration to be able to provide high resolution images. Therefore, there have been continuing attempts to reduce the size of the thin film transistor in order to form many more pixels per unit area. As a result, the size of the semiconductor layer 100 is formed as small as possible in manufacturing the thin film transistor. However, miniaturization of the thin film transistor causes each end portion 210 of the doping region 200 (provided with contact holes (not shown) and which are connected to the source and drain electrodes) to have a width formed to be wider as compared to the other (or the remaining) portion of the doping region 200.

Figure 2:
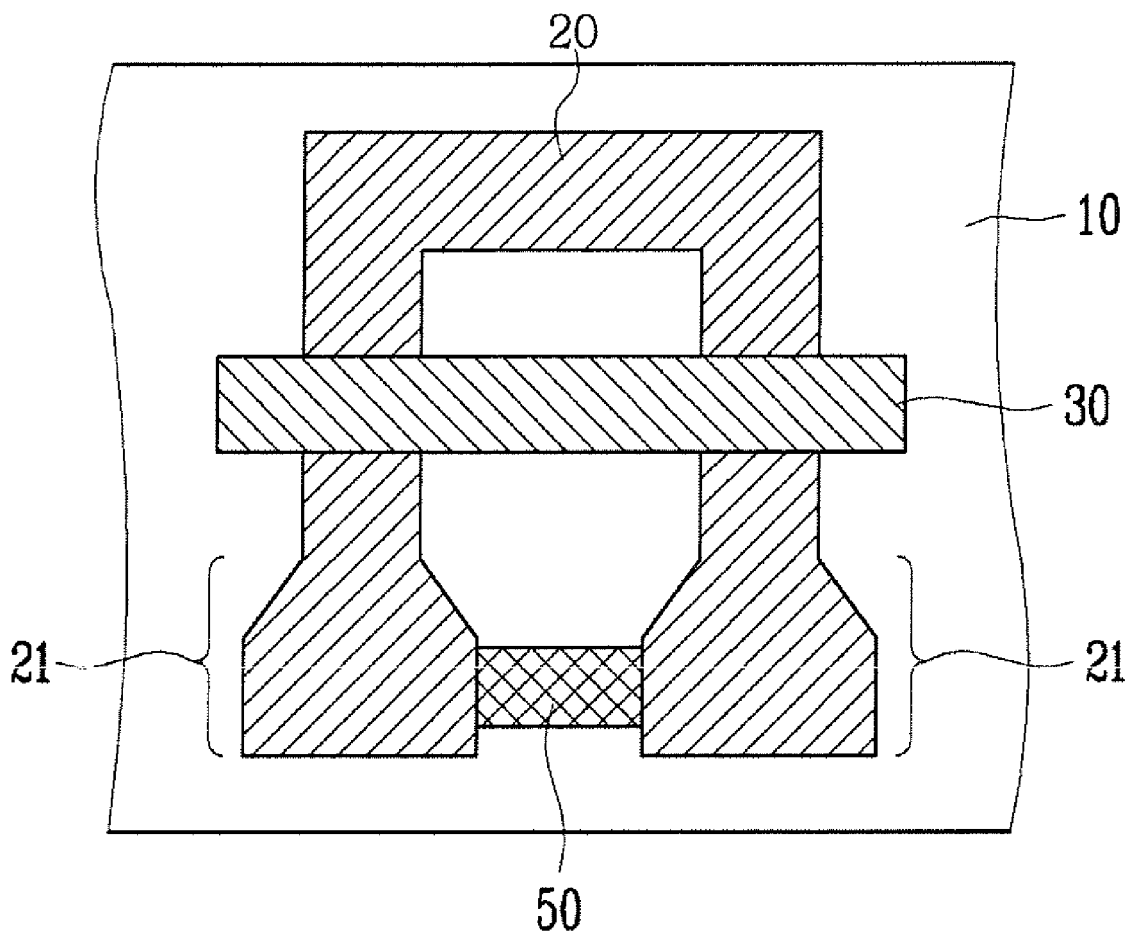
FIG. 2 is a plan view of a typical thin film transistor when a short circuit occurs.

Commonly, as shown in FIG. 2, when forming the semiconductor layer 100 and doping the impurities through a process of first depositing the amorphous silicon and crystallizing the deposited amorphous silicon with a laser, as the width of end portion 210 of each doping region 200 is wider than the width of the remainder portion of the doping region 200, it is highly possible for a connection region 50 connecting (or situated between) both end portions 210 to be doped (inadvertently, for example) in the process of forming the doping region 200.

Similarly, as shown in FIG. 3C, if a connection region 600 is doped (inadvertently, for example) as in the above case shown in FIG. 2, the contact hole (not shown) formed on each end portion 210 is short-circuited so that the thin film transistor cannot carry out the on/off switching function or operation. Accordingly, the protrusion 400 is formed in the thin film transistor for the flat panel display according to an aspect of the present invention, wherein the protrusion 400 is a part of the gate electrode 300, as described above, and is formed between the doping region 200 (e.g., formed to be situated between prongs of the letter U shaped doping region 200).

Assuming that the doping region 200 is doped with P-type impurities in a PMOS, if the gate voltage has positive (+) voltage, then the PMOS is in an off state even when the contact hole existing on each end portion 210 of the doping region 200 is short-circuited as shown in FIG. 3C. Thereby, since the voltage of the protrusion 400 has positive (+) voltage, although the two contact holes are short-circuited, current does not flow in the channel as would in a typical PMOS without the protrusion 400, making it possible to perform the on/off switching despite the short circuit. Therefore, although thin film transistor contains the short-circuit, it operates normally, making it possible to prevent the generation of bad lighting problems (defective pixels), such as bright spot (hot pixel), dark spot (dead pixel), and bad clustering (defective pixel clustering), etc. A corresponding effect is obtained for the NMOS device.

Hereinafter, a method for fabricating a thin film transistor according to an aspect of the present invention will be described with reference to FIGS. 3A and 3B. First, an insulating layer (not shown) is deposited on a substrate (not shown). Thereafter, an amorphous silicon is deposited on the substrate on which the insulating layer is deposited. The amorphous silicon is deposited through a chemical vapor deposition method or a low-temperature chemical vapor deposition method, etc., and is patterned as a semiconductor layer 100. Herein, the insulating layer is the same as that shown in the description of FIG. 3A.

When the semiconductor layer 100 is formed of polycrystalline silicon, the amorphous silicon, which has been deposited on the substrate (on which the insulating layer has been deposited) through a plasma chemical vapor deposition method or a low-temperature chemical vapor deposition, is annealed and crystallized with laser or heat. The semiconductor layer 100 is then patterned. At this time, when patterning the semiconductor layer 100, the doping region 200 is patterned into a letter U shape.

Thereafter, a gate insulating layer 500 is deposited on the semiconductor layer 100 and then, a metal thin film, such as Mo and MoW, etc., is deposited in sequence. The metal thin film is to be used as the gate electrode 300, and a protrusion 400, is patterned together with the gate electrode 300 in a way that does not overlap with the doping region 200 but is situated in the doping region 200. That is, the protrusion 400 is formed to be situated between prongs of the letter U shaped doping region 200.

Next, the doping region 200 of the semiconductor layer 100 is doped with impurities. When the semiconductor layer 100 is a P-type layer, the doping region 200 is doped with N-type impurities, and when the semiconductor layer 100 is a N-type layer, the doping region 200 is doped with P-type impurities. If the doping region 200 is doped with the N-type impurities, the semiconductor is referred to as an NMOS, and if the doping region is doped with the P-type impurities, the semiconductor is referred to as a PMOS.

Thereafter, an interlayer insulating layer (not shown) is deposited on the overall regions of an intermediate structure of the thin film transistor, contact holes are formed so that a part of source and drain region is exposed, and source and drain electrodes are formed by depositing metal wirings, to complete the thin film transistor.

In FIG. 3C, the gate electrode 300 is formed over a designated region of the doping region 200. Additionally, the protruding region 400 of the gate electrode 300 is formed to correspond to the end portion 210 of the doping region 200. Accordingly, the gate electrode 300 over the designated region may be referred to as a primary gate that is responsible for the primary switching of the thin film transistor, while the protruding portion 400 corresponding to the edge portion 210 may be referred to as a secondary gate or a back-up gate responsible for switching the thin film transistor should a short develop between the edge portion 210. In various aspects, the switching of the secondary gate is linked to the switching of the primary gate. For example, the switching may occur at the same time, or in a corresponding way.

Although the protrusion 400 is described above as being a portion of the gate electrode 300, as well as being of the same material as that of the gate electrode 300, such is not required. In other aspects, the protrusion 400 may be separated from the gate electrode 300 and be referred to as a secondary gate electrode 400. If separate, the secondary gate electrode 400 and the gate electrode 300 may be electrically connected via a contact or a wire. Also, if separate, a different voltage from that applied to the gate electrode 300 may be applied to the secondary gate electrode 400. Also, the protrusion 400 or the secondary gate electrode 400 may be of a different material from that of the gate electrode 300.

Although a few aspects of the present invention have been shown and described, it would be appreciated by those skilled in the art that changes might be made in the aspects without departing from the principles and spirit of the invention, the scope of which is defined in the claims and their equivalents.

What is claimed is:

1. A thin film transistor of a flat panel display including:
   a substrate on which an insulating layer is deposited,
   a semiconductor layer, which is a layer having width and length on the insulating layer, provided with doping regions in a letter U shape and a channel region situated between the doping regions;
   a gate insulating layer formed on the semiconductor layer;
   a gate electrode formed on the gate insulating layer to traverse the doping region; and
   a protrusion, which is a part of the gate electrode, formed on the gate insulating layer to be opposed to the channel region.

2. The thin film transistor of the flat panel display as claimed in claim 1, wherein the insulating layer is $SiN_x$ or $SiO_2$.

3. The thin film transistor of the flat panel display as claimed in claim 1, wherein the semiconductor layer is amorphous silicon or polycrystalline silicon.

4. The thin film transistor of the flat panel display as claimed in claim 1, wherein the insulating layer is $SiN_x$ or $SiO_2$.

5. The thin film transistor of the flat panel display as claimed in claim 1, wherein the gate electrode is Mo or MoW.

6. A method of fabricating a thin film transistor of a flat panel display comprising:
   depositing an insulating layer on a substrate,
   forming a semiconductor layer, which is a layer having width and length on the insulating layer, wherein the semiconductor layer is provided with doping regions in a letter U shape and a channel region situated between the doping regions;
   forming a gate insulating layer on the semiconductor layer;
   forming a gate electrode on the gate insulating layer to traverse the doping region; and
   forming a protrusion, which is a part of the gate electrode, on the gate insulating layer to be opposed to the channel region.

7. The method of fabricating the thin film transistor of the flat panel display as claimed in claim 6, wherein the insulating layer is $SiN_x$ or $SiO_2$.

8. The method of fabricating the thin film transistor of the flat panel display as claimed in claim 6, wherein the semiconductor layer is amorphous silicon or polycrystalline silicon.

9. The method of fabricating the thin film transistor of the flat panel display as claimed in claim 6, wherein the insulating layer is $SiN_x$ or $SiO_2$.

10. The method of fabricating the thin film transistor of the flat panel display as claimed in claim 6, wherein the gate electrode is Mo or MoW.

11. A thin film transistor of a flat panel display, comprising:
    a semiconductor layer having doped regions and a channel region positioned between the doped regions;
    a gate insulating layer formed on the semiconductor layer; and
    a gate structure formed on the gate insulating layer and including a primary gate and a secondary gate, the primary gate being formed over the doped regions and across the channel region to switch the thin film transistor, and the secondary gate being formed over the channel region to switch the thin film transistor if a short circuit is formed between the doped regions.

12. The thin film transistor of a flat panel display as claimed in claim 11, wherein the gate structure includes a gate electrode, a first portion of the gate electrode that extends over the doped regions and across the channel region being the primary gate, and a second portion of the gate electrode that extends from the first portion being the secondary gate.

13. The thin film transistor of a flat panel display as claimed in claim 11, wherein the primary and the secondary gates are connected so as to be able to receive a common voltage.

14. The thin film transistor of a flat panel display as claimed in claim 11, wherein the doped regions are letter U shaped prongs connected in the middle.

15. The thin film transistor of a flat panel display as claimed in claim 11, wherein the thin film transistor is able to switch a pixel that is included in the flat panel display.

16. A method of fabricating a thin film transistor of a flat panel display, comprising:
    forming a semiconductor layer having doped regions and a channel region positioned between the doped regions;
    forming a gate insulating layer on the semiconductor layer; and
    forming a gate structure on the gate insulating layer and including a primary gate and a secondary gate, the primary gate being formed over the doped regions and across the channel region to switch the thin film transistor, and the secondary gate being formed over the channel region to switch the thin film transistor if a short circuit is formed between the doped regions.

17. The method of fabricating the thin film transistor of a flat panel display as claimed in claim 16, wherein the forming of the gate structure includes forming a gate electrode, including a first portion of the gate electrode extending over the doped regions and across the channel region to be the primary gate, and a second portion of the gate electrode extending from the first portion to be the secondary gate.

18. The method of fabricating the thin film transistor of a flat panel display as claimed in claim 16, wherein the forming of the gate structure includes forming the primary and the secondary gates to be connected so as to be able to receive a common voltage.

19. The method of fabricating the thin film transistor of a flat panel display as claimed in claim 16, wherein forming of the semiconductor layer includes forming doped regions that are letter U shaped prongs connected in the middle.

20. The method of fabricating the thin film transistor of a flat panel display as claimed in claim 16, wherein the thin film transistor is formed to be able to switch a pixel that is included in the flat panel display.

* * * * *